(12) United States Patent
Ohno

(10) Patent No.: US 6,434,038 B1
(45) Date of Patent: Aug. 13, 2002

(54) NON-VOLATILE MEMORY USING FERROELECTRIC MATERIAL AND MANUFACTURING METHOD THEREOF

(75) Inventor: Morihumi Ohno, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 09/791,760

(22) Filed: Feb. 26, 2001

(30) Foreign Application Priority Data

Feb. 25, 2000 (JP) ........................................ 2000-049374

(51) Int. Cl.[7] .............................................. G11C 11/22
(52) U.S. Cl. ...................................................... 365/145
(58) Field of Search .......................... 365/145, 94, 157, 365/158, 149

(56) References Cited

U.S. PATENT DOCUMENTS

| 5,159,183 A | | 10/1992 | Yamaguchi ................. 235/492 |
| 5,525,528 A | | 6/1996 | Perino et al. .................. 437/7 |
| 5,555,219 A | | 9/1996 | Akiyama et al. ........... 359/103 |
| 5,905,672 A | * | 5/1999 | Seyyedy ..................... 365/145 |
| 5,943,256 A | * | 8/1999 | Shimizu et al. ........ 365/185.08 |
| 6,078,516 A | * | 6/2000 | Hayashi ....................... 365/145 |
| 6,128,213 A | * | 10/2000 | Kang ........................... 365/145 |
| 6,201,731 B1 | * | 3/2001 | Kamp et al. ............ 365/185.02 |
| 6,246,603 B1 | * | 6/2001 | Brady ......................... 365/145 |

FOREIGN PATENT DOCUMENTS

JP 09-232532 9/1997

* cited by examiner

*Primary Examiner*—Tan T. Nguyen
(74) *Attorney, Agent, or Firm*—Venable; Robert J. Frank

(57) ABSTRACT

A non-volatile memory including a storage device composed of a ferroelectric material having first and second remaining polarization characteristics offset from each other. Selection of a first or a second remaining polarization characteristic is determined by a predetermined voltage applied to the ferroelectric material. A controller outputs a control signal, in response to a predetermined address signal, which is applied to the storage device and the controller. The address signal includes for each address a data portion and an offset portion, the offset portion corresponding to either the first or the second remaining polarization characteristic. The control signal couples a first predetermined voltage to the storage device when the offset portion of the address signal corresponds to the first remaining polarization characteristic and couples a second predetermined voltage to the storage device when the offset portion of the address signal corresponds to the second remaining polarization characteristic. A reader coupled to the controller outputs data from the storage device at a remaining polarization value selected by the address signal in accordance with the control signal.

4 Claims, 6 Drawing Sheets

NON-VOLATILE MEMORY USING FERROELECTRIC MATERIAL AND MANUFACTURING METHOD THEREOF

BACKGROUND OF THE INVENTION (i) Field of the Invention

The present invention relates to a ferroelectric memory used in, e.g., an IC card to record information thereon.

(ii) Description of the Related Art

FIG. 1 is a block diagram showing an example of a prior art IC card.

This IC card is supplied with required power by electromagnetic coupling with a non-illustrated card read/write unit and provided with an antenna coil 11 for transmitting/receiving data. To the antenna coil 11 are connected a power supply portion 12 for converting power obtained by electromagnetic coupling into a direct-current voltage to be supplied to each part in the IC card and a switching portion 13 for switching between transmission and reception of data.

The receiving side of the switching portion 13 is connected to a central processing unit (which will be referred to as a "CPU" hereinafter) 16 through a demodulating portion 14 and decoding portion 15. Further, the CPU 16 is connected to the transmitting side of the switching portion 13 via an encoding portion 17 and a modulating portion 18. The decoding portion 15 and the encoding portion 17 are designed for encoding data to be transmitted/received between the IC card and the card read/write unit. Moreover, the demodulating portion 14 and the modulating portion 18 are used for transmitting/receiving encoded data in the form of a signal suitable for a transmission path.

To the CPU 16 are connected a ROM (Read Only Memory) 19 in which a processing program is stored and a non-volatile memory 20 such as an EEPROM (Electrically Erasable & Programmable Read Only Memory) for storing processed data, and an encrypting portion 21 for encrypting data to be stored in the non-volatile memory 20.

When such an IC card is set in the card read/write unit, electromotive force induced in the antenna coil 11 is given to the power supply portion 12, and the power supply portion 12 generates necessary direct-current power to be fed to each part in the IC card. On the other hand, a signal received by the antenna coil 11 is demodulated into reception data by the demodulating portion 14, and this data is further converted from a cipher text into a plain text by the decoding portion 15. The reception data outputted from the decoding portion 15 is supplied to the CPU 16 to be processed in accordance with a program in the ROM 19. A part of the data obtained as a result of processing is fed to the encrypting portion 21 to be encrypted and further saved in the non-volatile memory 20.

In addition, the data stored in the non-volatile memory 20 is read via the encrypting portion 21 to be processed in the CPU 16. Transmission data as a result of processing executed by the CPU 16 is encrypted by the encoding portion 17 and then modulated by the modulating portion 18 to be transmitted from the antenna coil 11.

As described above, in the IC card, data to be transmitted/received to/from the card read/write unit is encrypted by the decoding portion 15 and the encoding portion 17 to improve privacy, and data to be stored in the non-volatile memory 20 is encrypted by the encrypting portion 21. Consequently, even if the stored content in the non-volatile memory 20 is read by a physical technique such as resin removal or optical analysis, security is protected so as not to decrypt the content of data.

The prior art IC card, however, has the following problem.

That is, the encrypting portion 21 is required in order to encrypt data to be stored in the non-volatile memory 20. The size of the encrypting portion 21 may differ depending on a number of digits of a cipher key or an arithmetic operation method. For example, in case of a 32-bit key, an encryption processing circuit having a scale of approximately 10,000 gates is required. There is, thus, a problem such that a required area of the encrypting portion 21 occupying in the IC card is increased.

In order to eliminate the above-described drawback in the prior art, an object of the present invention is to provide a non-volatile memory which can reduce its necessary area and protect security and a manufacturing method thereof.

SUMMARY OF THE INVENTION

To achieve this aim, according to a first aspect of the present invention, a non-volatile memory comprises: storing means which uses as a storage device a ferroelectric material whose remaining polarization characteristic changes due to application of a predetermined voltage under a constant temperature condition and sets the storage device to have either a first remaining polarization characteristic or a second remaining polarization characteristic for each address in accordance with a predetermined address pattern; controlling means for outputting based on the address pattern a control signal indicative of distinction of the remaining polarization characteristic of the storage device selected by an address signal; and reading means for reading data in the storing means by determining in accordance with the control signal a remaining polarization value of the storage device selected by the address signal and outputted from the storing means.

According to the first aspect of the present invention, since the non-volatile memory is configured as described above, the following action is performed.

The storage device of the storing means is selected by the address signal, and the remaining polarization value of its ferroelectric material is outputted to the reading means. Further, the controlling means outputs the control signal indicative of distinction of the remaining polarization characteristic of the storage device selected by the address signal. The reading means determines in accordance with the control signal outputted from the controlling means the remaining polarization value outputted from the storing means, thereby reading data in the storage device.

According to a second aspect of the present invention, in a method for manufacturing a non-volatile memory by which a plurality of insulated gate type transistors and a plurality of ferroelectric capacitors are formed on a silicon substrate and the insulated gate type transistors are electrically connected to the ferroelectric capacitors to form a plurality of memory cells selectable by an address signal, there is added processing that a predetermined memory cell in a plurality of the memory cells is sequentially selected by using the address signal and a predetermined voltage is applied to the ferroelectric capacitor of the selected memory cell under a constant temperature condition to change the remaining polarization characteristic.

DETAILED DESCRIPTION OF THE INVENTION

Figure 1:
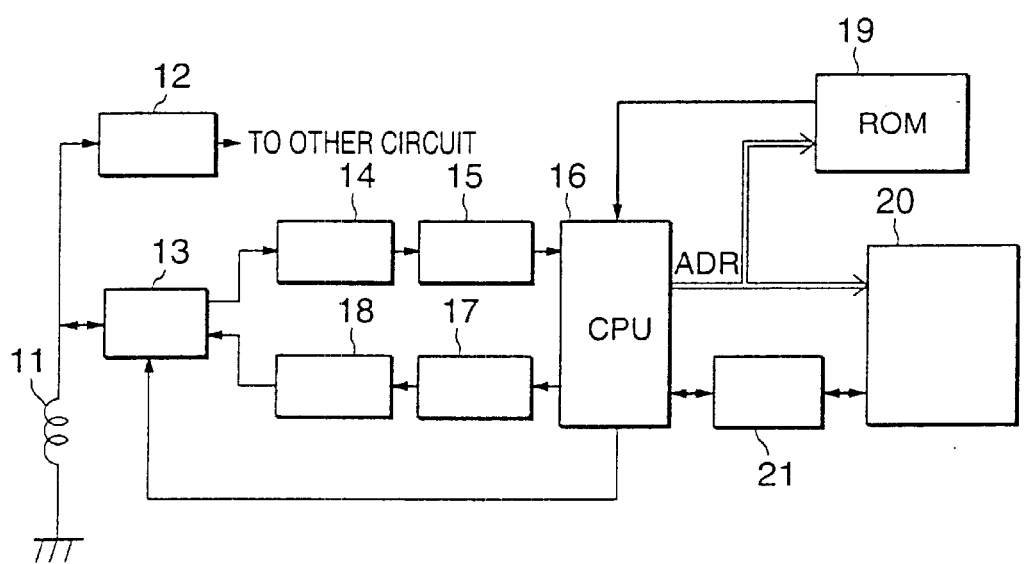
FIG. 1 is a block diagram showing an example of a prior art IC card.
Figure 2:
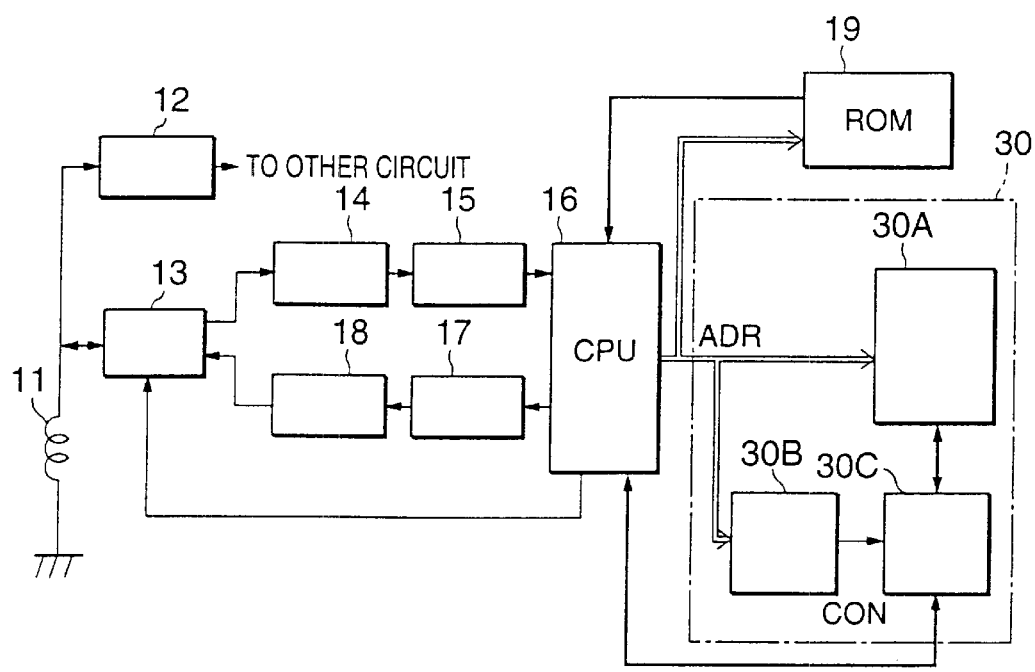
FIG. 2 is a block diagram of an IC card showing an embodiment according to the present invention including a non-volatile memory 30.

FIG. 2 is a block diagram of an IC card showing an embodiment according to the present invention, in which like reference numerals denote constituent elements common to those in FIG. 1.

The IC card is supplied with required power by electromagnetic coupling with a non-illustrated card read/write unit and has an antenna coil 11 for transmitting/receiving data, as similar to FIG. 1. To the antenna coil 11 are connected a power supply portion 12 for converting power obtained by electromagnetic coupling into a direct-current voltage to be supplied to each part in the IC card and a switching portion 13 for switching between transmission and reception of data.

The receiving side of the switching portion 13 is connected to the CPU 16 through the demodulating portion 14 and the decoding portion 15. The CPU 16 is connected to the transmitting side of the switching portion 13 via the encoding portion 17 and the modulating portion 18. The decoding portion 15 and the encrypting portion 17 constitute a receiving circuit and demodulating portion 14 and the modulating portion 18 constitute a communication circuit, respectively.

To the CPU 16 is connected a ROM 19 in which a processing program is stored. Further, the non-volatile memory 30 for storing data as a result of processing is connected to the CPU 16. The non-volatile memory 30 is constituted by storing means (for example, a storing portion or a storage device) 30A, controlling means or a controller (for example, an offset controlling portion) 30B and reading means or a reader (for example, an amplifying portion) 30C. As to the storing portion 30A, a ferroelectric material capable of offsetting a remaining polarization value by heat treatment is used as a memory cell as will be described later, and setting presence/absence of offset in units of each memory cell keeps privacy of data.

The offset controlling portion 30B is constituted by, e.g., a logic operation circuit and performs arithmetic processing based on an address signal ADR supplied thereto to output a control signal CON indicative of presence/absence of offset of a memory cell as a target of reading/writing. Further, the amplifying portion 30C reads/writes a content of the memory cell in accordance with the control signal CON.

Figure 3:
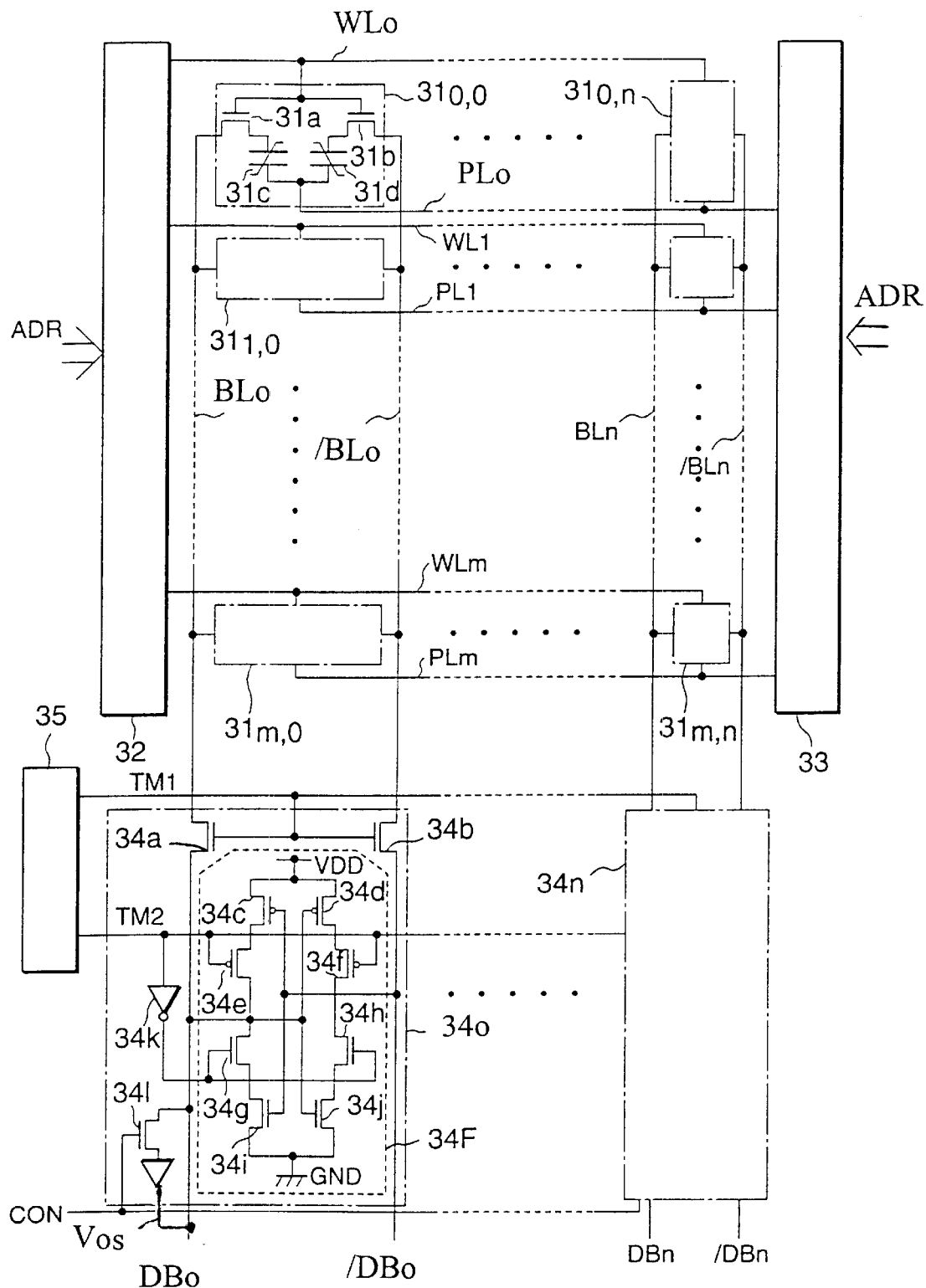
FIG. 3 is a schematic block diagram showing the electrical circuits comprising portions of the non-volatile memory 30 depicted in FIG. 2.

FIG. 3 is a schematic block diagram showing the electrical circuits comprising portions of the non-volatile memory 30 depicted in FIG. 2.

The non-volatile memory 30 has word lines WLx (where x=0 to m) arranged in parallel with each other and plate lines PLx alternately arranged in parallel with these word lines WLx. The non-volatile memory 30 further has complementary bit lines BLy and /BLy (where y=0 to n and "/" means inversion) arranged so as to be orthogonal to the word lines WLx and plate lines PLx. A memory cell $31_{x,\,y}$ is arranged at each intersection of the word lines WLx, the plate lines PLx and the bit lines BLy and /BLy.

Respective memory cells $31_{x,\,y}$ have the same configuration. As illustrated by an example of the memory cell $31_{o,\,o}$, the memory cell is constituted by two N channel MOS transistors (which will be referred to as "NMOS" hereinafter) 31a and 31b and two ferroelectric capacitors 31c and 31d. The NMOSs 31a and 31b have gates commonly connected to the word line WLx, drains commonly connected to the plate line PLx through the ferroelectric capacitors 31c and 31d and sources connected to the bit lines BLy and /BLy. As will be described later, the ferroelectric capacitors 31c and 31d are heat treated in the production process and presence/absence of offset of the remaining polarization value is previously set in units of each memory cell.

The word line WLx and the plate line PLx are connected to a word decoder 32 and a plate decoder 33, respectively. A pair of word line WLx and the plate line PLx selected using an address signal ADR are activated by the word decoder 32 and the plate decoder 33 so that memory cells $31_{x,\,o}$ to $31_{x,\,n}$ connected to these lines are selected.

Each of the bit lines BLy and /BLy is connected to a sense amplifier $34_y$. Respective sense amplifiers $34_y$ have the same configuration. As illustrated by an example of the sense amplifier $34_o$, it is constituted by NMOSs 34a and 34b for switches, P-channel MOS transistors (which will be referred to as "PMOS" hereinafter) 34c, 34d, 34e and 34f forming a flip flow 34F for data latch, an inverter 34k for generating a complementary timing signal, and an NMOS 34l for switches which control an offset voltage Vos.

The bit lines BLy and /BLy are connected to complementary data bit lines DBy and /DBy through the NMOSs 34a and 34b which are turned on/off by a timing signal TM1 from a timing circuit 35. Further, to the data bit lines DBy and /DBy is connected a flip flop 34F whose operation is controlled by a timing signal TM2 from the timing circuit 35. Moreover, the data bit line DBy is connected to an offset voltage Vos through the NMOS 34l energized by a control signal CON supplied from the offset controlling portion 30B. The data bit lines DBy and /DBy are connected to the CPU 16 as data buses for transferring data to be written/read into/from the selected memory cell $31_{x,\,y}$.

Figure 4:
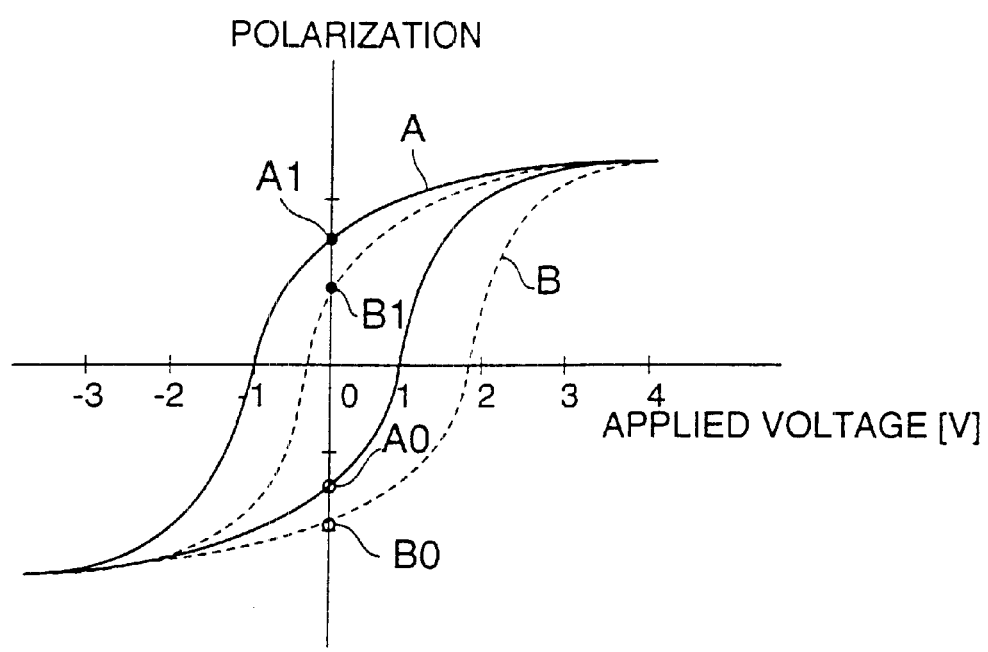
FIG. 4 is an explanatory drawing of storage principle of a memory cell 31.

FIG. 4 is an explanatory drawing of the storage principle of the memory cell 31 depicted in FIG. 3.

In FIG. 4, a horizontal axis represents a voltage to be applied to the ferroelectric capacitors 31c and 31d in the memory cell 31, and a vertical axis represents a polarization value of the ferroelectric capacitors 31c and 31d. A solid line A in FIG. 4 indicates a hysteresis characteristic of a ferroelectric capacitor which has not been subjected to heat treatment, and a broken line B represents a hysteresis characteristic of a ferroelectric capacitor which has been subjected to heat treatment in which a voltage of 3 to 7 V is applied. It is apparent from FIG. 4 that the hysteresis loop is shifted to the right side to enter the imprint state by performing heat treatment.

When a voltage of, e.g., +2 V is applied to be then turned into 0 V in order to write a logic value "1" to the ferroelectric capacitor indicated by the solid line A, the polarization value corresponding to a point A1 is stored as a remaining polarization value. Additionally, when a voltage of, e.g., −2 V is applied to be turned into 0 V in order to write a logic value "0", the polarization value corresponding to a point A0 is stored. On the other hand, when a voltage of, e.g., +3 V is applied to be then turned into 0 V in order to write a logic value "1" to the ferroelectric capacitor indicated by the broken line B, the polarization value corresponding to a point B1 is stored as a remaining polarization value. Further, when a voltage of, e.g., −1 V is applied to be then turned into 0 V in order to write a logic value "0", the polarization value corresponding to a point B0 is stored as a remaining polarization value.

Even if the same logic value is written as described above, the remaining polarization value to be stored differs depending on presence/absence of heat treatment of the ferroelectric capacitor. An appropriate voltage must be applied in accordance with presence/absence of heat treatment in writing data. That is, data must be written into the heat treated memory cell by offsetting the application voltage by only +1 V. Further, in case of reading data, it can not be correctly read by the sense amplifier having a fixed threshold value. That is, in regard to the heat treated memory cell, the threshold voltage must be offset by only +1 V to read data. In order to correctly read and write, information representing presence/absence of offset for each address is, therefore, required.

FIGS. 5A to 5I are production process charts of a ferroelectric memory used as the non-volatile memory 30. This ferroelectric memory is produced in accordance with the following steps 1 to 11.

Figure 5A:
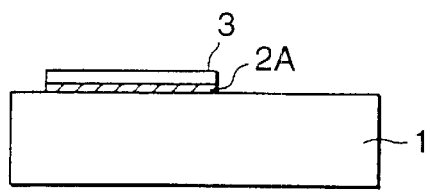
FIGS. 5A to 5I are production process charts of a ferroelectric memory used as the non-volatile memory 30.

(1) Step 1 (FIG. 5A)

A first oxide film ($SiO_2$) 2A and a silicon nitride film ($Si_3N_4$) 3 are sequentially grown on the entire P type silicon substrate 1, and $SiO_2$ and $Si_3N_4$ are then removed from an area (field) which becomes a transistor (that is, NMOS 31a and 31b in the memory cell 31).

Figure 5B:
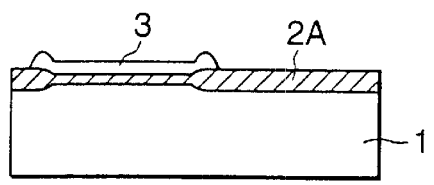

(2) Step 2 (FIG. 5B)

The silicon substrate 1 is subjected to thermal oxidation. Since $Si_3N_4$ is not oxidized, a thick oxide film 2A can be formed in the field portion.

Figure 5C:
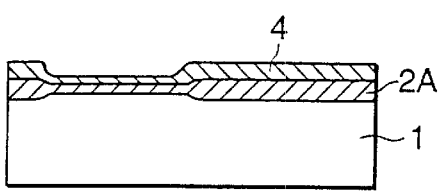

(3) Step 3 (FIG. 5C)

After removing the silicon nitride film 3, a gate oxide film of the transistor and a polysilicon layer 4 which becomes a gate are grown.

Figure 5D:
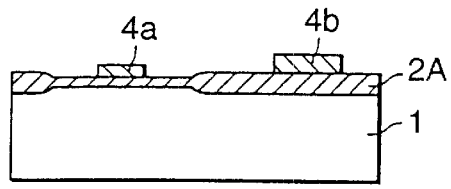

(4) Step 4 (FIG. 5D)

The polysilicon layer 4 is etched to form gate polysilicon 4a which becomes a gate portion and a wiring polysilicon 4b which becomes a wiring portion.

Figure 5E:
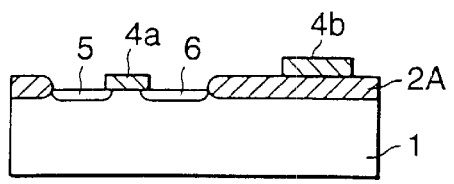

(5) Step 5 (FIG. 5E)

Ions of N type impurities are implanted on the entire surface of a wafer. As a result, the N type impurities implanted on the transistor field form a source 5 and a drain 6.

Figure 5F:
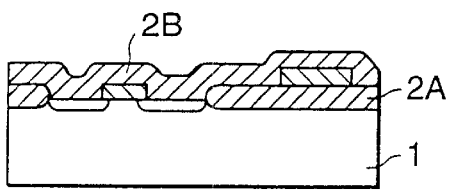

(6) Step 6 (FIG. 5F)

A second oxide film 2B is grown on the entire wafer.

Figure 5G:
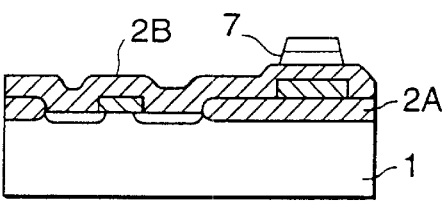

(7) Step 7 (FIG. 5G)

A metal film, a ferroelectric material and a metal film are sequentially deposited on the oxide film 2B to form an MFM (Metal-Ferroelectric-Metal) layer 7. Further, any portion other than the MFM layer 7 in areas which become ferroelectric capacitors 31c and 31d in the memory cell 31 is removed.

Figure 5H:
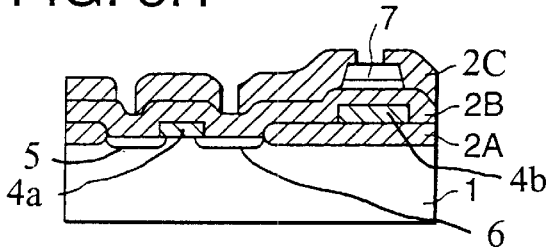

(8) Step 8 (FIG. 5H)

After forming a third oxide film 2C on the entire wafer, windows are formed to the oxide films 2B and 2C in order to make a contact with the gate polysilicon 4a, the wiring polysilicon 4b, the source 5, the drain 6, the MFM layer 7 and others.

Figure 5I:
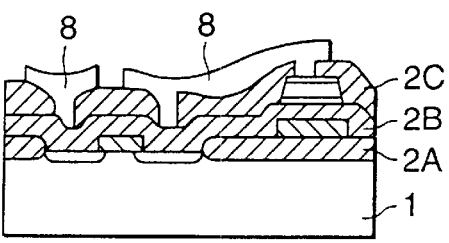

(9) Step 9 (FIG. 5I)

After depositing aluminium on the entire wafer, aluminium on areas other than the wiring 8 is etched to be removed.

(10) Step 10

The surface is covered with glass to protect the device, and only a bonding pad portion is etched to be removed.

(11) Step 11

A voltage of 3 to 7 V is applied between a plate line and a word line of a desired memory cell in inactive gas atmosphere having a temperature of 120 to 180− in accordance with a predetermined address pattern and heat treatment is performed to form an offset cell. The subsequent steps such as cutout of the memory chip from the water, mounting onto a package, wire bonding and others are similar to those of a semiconductor device.

The operation of the IC card shown in FIG. 2 will now be described with reference to FIGS. 3 and 4.

When the IC card depicted in FIG. 2 is set in a non-illustrated card read/write unit, electromotive force induced in the antenna coil 11 is given to the power supply portion 12, and the power supply portion 12 generates required direct-current power to be fed to each part in the IC card. On the other hand, a signal received by the antenna coil 11 enters the receiving circuit consisting of the demodulating portion 14 and the decoding portion 15. The reception data outputted from the decoding portion 15 is supplied to the CPU 16 and processed based on a program in the ROM 19. A part of the data as a result of processing is stored in the non-volatile memory 30.

Data is stored in the non-volatile memory 30 as follows.

When the address signal ADR is first supplied from the CPU 16 in the non-volatile memory 30, the address signal ADR is decoded by the word decoder 32 and the plate decoder 33 depicted in FIG. 3 and a specific memory cell (for example, $31_{o,\,0}$ to $31_{o,\,n}$) is selected. As a result, the NMOSs 31a and 31b are turned on in, e.g., a memory cell $31_{o,\,o}$, and the ferroelectric capacitors 31c and 31d are connected to the bit lines BL0 and /BL0, respectively.

Further, the address signal ADR is supplied to the offset controlling portion 30B, and the control signal CON indicative of presence/absence of offset of a memory cell designated by the address signal ADR is outputted.

On the other hand, the data signal supplied from the CPU 16 through the data bit lines DB0 and /DB0 is fed to the flip flop 34F. At this time, judgement is made upon whether the offset voltage Vos is to be overlapped on the data bit line DB0 by using the NMOS 341 controlled by the control signal CON outputted from the offset controlling portion 30B. That is, when an address which has been subjected to offsetting is designated, the offset voltage Vos is overlapped on the data bit line DB0. Furthermore, when an address which has not been subjected to offsetting is designated, the offset voltage Vos is not overlapped on the data bit line $DB_o$.

Subsequently, the NMOSs 34a and 34b are turned on by the timing signal TM1 from the timing circuit 35, and the data bit lines $DB_o$ and $/DB_o$ are respectively connected to the bit lines $BL_o$ and $/BL_o$. In addition, the sense amplifier $34_o$ is activated by the timing signal TM2, and the voltages of the data bit lines $DB_o$ and $/DB_o$ are applied to the ferroelectric capacitors 31c and 31d of the memory cell $31_{o,\,o}$ so that data is written in accordance with presence/absence of offset.

The data stored in the non-volatile memory 30 is read as follows.

A specific memory cell (for example $31_{o,\,o}$ to $31_{o,\,n}$) is selected based on the address signal ADR supplied from the CPU 16 as similar to the example of writing, and the NMOSs 31a and 31b of, e.g., a memory cell $31_{o,\,o}$ are turned on so that the ferroelectric capacitors 31c and 31d are connected to the bit lines $BL_o$ and $/BL_o$.

Further, the control signal CON indicative of presence/absence of offset of a memory cell designated by the address signal ADR is outputted from the offset controlling portion 30B. The NMOS 341 is controlled by the control signal CON and judgment is made upon whether the offset voltage Vos to be overlapped on the data bit line $DB_o$ is present or absent. That is, when an address which has been subjected to offsetting is designated, the offset voltage Vos is overlapped as a threshold voltage on the data bit line DBO. When, an address which has not been subjected to offsetting is designated, the offset voltage Vos is not overlapped on the data bit line $DB_o$.

Subsequently, the NMOSs 34a and 34b are turned on by the timing signal TM1 from the timing circuit 35, and the bit lines $BL_o$ and $/BL_o$ are respectively connected to the data bit lines $DB_o$ and $/DB_o$. As a result, the electric potentials held in the ferroelectric capacitors 31c and 31d are supplied to the data bit lines $DB_o$ and $/DB_o$. Further, when the sense amplifier $34_o$ is activated by the timing signal TM2, the difference in potential between the data bit lines $DB_o$ and $/DB_o$ is amplified by the flip flop 34F, and the stable logic level potential is outputted to the data bit lines $DB_o$ and $/DB_o$. That is, the data is read by using the threshold voltage in dependence on the presence/absence of offset.

The data read from the non-volatile memory 30 is processed by the CPU 16. The transmission data as a result of processing executed by the CPU 16 is transmitted from the antenna coil 11 through the encoding portion 17 and the transmission circuit of the modulating portion 18.

As described above, the IC card according to the present embodiment stores the data in the non-volatile memory 30 which has been selectively subjected to offset processing. Therefore, the stored content can not be read from the storing portion 30A even if a physical technique such as resin removal or optical analysis is applied to this portion. On the other hand, since the offset controlling portion 30B for calculating the address signal ADR to determine presence/absence of offset manages presence/absence of the offset processing for each memory cell, the circuit scale can be made smaller and the processing time can be further reduced as compared with the encrypting portion for encrypting the data itself in the prior art.

It is to be noted that the present invention is not restricted to the above embodiment, and various modifications thereof are possible. As modifications, there are following (a) to (f), for example.

(a) Although FIG. 2 shows an example where the non-volatile memory 30 is applied to the non-contact type IC card, the present invention is not restricted to the IC card, and it can be similarly applied as a non-volatile memory which provides security in any application.

(b) The structure of the offset controlling portion 30B in FIG. 2 can be appropriately changed in accordance with an address pattern of the offset. For example, when the offset is randomly carried out irrespective of a value of an address, a ROM and the like can be used.

(c) The structure of the memory cell 31 is not restricted to the circuit illustrated in FIG. 3. One transistor and one ferroelectric capacitor may be used to store one bit. In such a case, a sense amplifier which is suitable for this arrangement must be used.

(d) The structure of the sense amplifier 34 is not restricted to the circuit in FIG. 3.

(e) A temperature or an application voltage for the offset relative to the memory cell 31 is not restricted to the value illustrated as an example. An optimum value may differ depending on a material or a film thickness of the ferroelectric capacitor.

(f) In the non-volatile memory shown in FIG. 3, the memory cell 31 having the ferroelectric capacitors 31c and 31d is used to perform the offset processing utilizing heat treatment relative to the memory cell having a specific address, thereby executing encryption. An EEPROM using an insulated gate type field effect transistor (MOSFET) having a floating gate structure may substitute for the memory cell 31 using the ferroelectric capacitors 31c and 31d.

Figure 6:
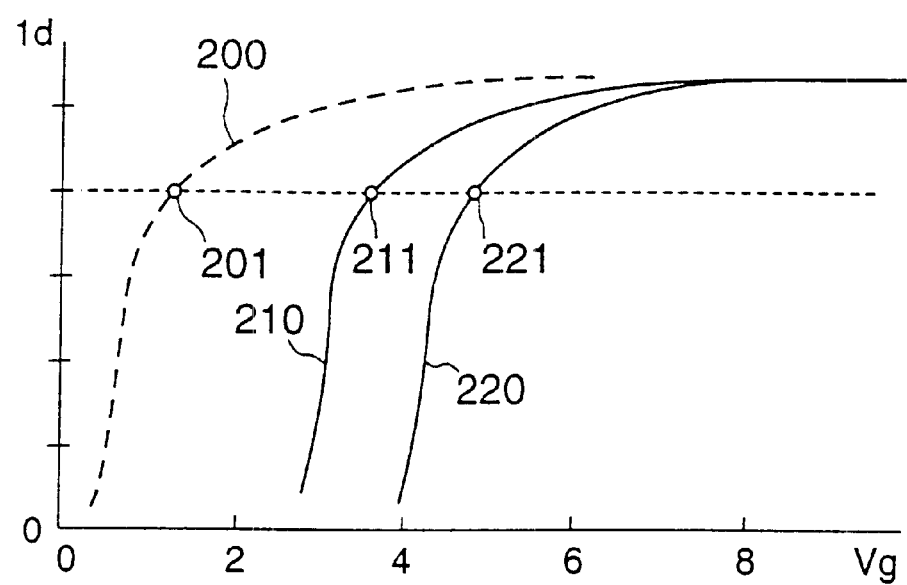
FIG. 6 is a characteristic view showing relationship between a quantity of electric charge accumulated in a floating gate of an MOSFET and a drain current.

FIG. 6 is a characteristic view showing the relationship between an electric charge quantity accumulated in the floating gate of the MOSFET and the drain current. As shown in FIG. 6, encryption of the non-volatile memory using the EEPROM utilizes the drain current Id characteristic which varies in accordance with the electric charge quantity accumulated in the floating gate.

In the EEPROM, the read gate voltages having the drain current Vg, 201 and 211 are respectively threshold values in accordance with the electric charge quantity accumulated in the floating gate in the I-V curve 200 in FIG. 6 so that data "0" and "1" are stored. The data is written and read by using a cell array arranged in the form of a matrix, a decoder and a sensor latch circuit.

The data encrypting function is added to the non-volatile memory by the following technique.

In the EEPROM, at the time of writing/reading data, the electric charge is injected and drawn into/from the floating gate by a tunnel current flowing through a tunnel oxide film. The tunnel current varies depending on a thickness of the tunnel oxide film or a quantity of trap level in the tunnel oxide film. When the tunnel oxide film is thin or when the trap level in the tunnel oxide film becomes higher, the tunnel current increases, and the electric charge accumulated in the floating gate also increases. Therefore, a high threshold value such as indicated by a point 221 in FIG. 6 can be obtained.

As a preferred embodiment in this case, high energy such as hydrogen, oxygen, fluorine or helium atoms is injected into the tunnel oxide film. Since the energy is injected through the floating gate and the control gate provided thereon, the energy is set so that the range of atoms becomes the tunnel film taking the permeable film thicknesses of these gates into consideration.

Although data is read from the EEPROM by using the sensor latch circuit, if there are EEPROM cells having the above-described high threshold value in the EEPROM cell array, a plurality of cells having the high threshold value exist with respect to a reference voltage. Therefore, reading becomes unstable by using the uniform sensor latch circuit. However, if a positions of an offset cell having a different threshold value is determined, providing a level shifter to the corresponding sensor latch circuit enables normal reading.

It is to be noted that the offset cell is formed on a wafer process by performing the high-energy injection using a mask with a desired pattern. As a result, it is possible to obtain the advantages similar to those of the non-volatile memory using the ferroelectric capacitor described in the foregoing embodiment.

As mentioned above, according to the first aspect of the present invention, since the ferroelectric material having two types of remaining polarization characteristics is used as the storage device of the storing means, the stored content can not be read by the physical technique from outside. Further, there are provided the controlling means for outputting based on the address pattern the control signal indicative of distinction of the remaining polarization characteristic for each address of the storing means and reading means for determining the remaining polarization value of the storage device in accordance with the control signal, correct data can be rapidly read by the circuit having a small necessary area without requiring the large scale circuit such as an encryption circuit and processing.

According to the second aspect of the present invention, after forming the memory cell, a process for applying a predetermined voltage to change the remaining polarization characteristic under a constant temperature condition is added. Consequently, the remaining polarization characteristic can be changed in accordance with the preset address pattern.

What is claimed is:

1. A non-volatile memory using a ferroelectric material comprising:

storing means which uses as a storage device a ferroelectric material whose remaining polarization characteristic changes by application of a predetermined voltage under a constant temperature condition and sets said storage device to have either a first or second remaining polarization characteristic in accordance with a predetermined address pattern for each address, said address pattern including for each address a data portion and an offset portion, the offset portion of said address pattern corresponding to either said first or said second remaining polarization characteristic;

controlling means for outputting a control signal based on the offset portion of either said first or second said address pattern, said control signal being indicative of the remaining polarization characteristic of said storage device; and reading means for reading data of said storing means by determining a remaining polarization value of said storage device selected by said address signal and outputted from said storing means in accordance with said control signal.

2. The non-volatile memory using a ferroelectric material according to claim 1, wherein said non-volatile memory using a ferroelectric material is mounted on an IC card.

3. A non-volatile memory comprising:

a storage device composed of a ferroelectric material having first and second remaining polarization characteristics offset from each other, selection of said first or second remaining polarization characteristic being determined by a predetermined voltage applied to said ferroelectric material;

a controller for outputting a control signal;

means for applying a predetermined address signal to said storage device and said controller, the address signal including for each address a data portion and an offset portion, the offset portion corresponding to either said first or said second remaining polarization characteristic, said control signal coupling a first predetermined voltage to said storage device when the offset portion of said address signal corresponds to said first remaining polarization characteristic and coupling a second predetermined voltage to said storage device when the offset portion of said address signal corresponds to said second remaining polarization characteristic; and a reader coupled to said controller for outputting data from said storage device at a remaining polarization value selected by said address signal in accordance with said control signal.

4. In combination, the non-volatile memory defined by claim 3 and an IC card, said non-volatile memory being mounted on said IC card.

* * * * *